(12) United States Patent
Carter et al.

(10) Patent No.: US 6,423,627 B1
(45) Date of Patent: Jul. 23, 2002

(54) METHOD FOR FORMING MEMORY ARRAY AND PERIPHERY CONTACTS USING A SAME MASK

(75) Inventors: Duane E. Carter, Plano; Ming J. Hwang, Dallas, both of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/407,560

(22) Filed: Sep. 28, 1999

Related U.S. Application Data

(60) Provisional application No. 60/102,177, filed on Sep. 28, 1998.

(51) Int. Cl.[7] ......................................... H01L 21/4763
(52) U.S. Cl. ....................... 438/620; 438/233; 438/587; 438/672
(58) Field of Search ................... 438/233, 586, 438/587, 620, 622, 633, 637, 672, 675, 761, 778

(56) References Cited

U.S. PATENT DOCUMENTS

| | | | | |
|---|---|---|---|---|
| 5,718,800 A | * | 2/1998 | Juengling | 438/200 |
| 5,909,616 A | * | 6/1999 | Dennison | 438/232 |
| 5,949,145 A | * | 9/1999 | Komuro | 257/797 |
| 6,071,799 A | * | 6/2000 | Park et al. | 438/595 |
| 6,146,949 A | * | 11/2000 | Wu | 438/275 |
| 6,165,878 A | * | 12/2000 | Haruhana et al. | 438/586 |

FOREIGN PATENT DOCUMENTS

JP 11-284138 A * 10/1999

* cited by examiner

*Primary Examiner*—Carl Whitehead, Jr.
*Assistant Examiner*—Jamie L. Brophy
(74) *Attorney, Agent, or Firm*—Carlton H. Hoel; W. James Brady; Frederick J. Telecky, Jr.

(57) ABSTRACT

Contacts for an electronic device are formed by providing a substrate (12) that has at least two access line structures (16) for a memory array (14) and a periphery structure (20) for a peripheral circuit (18) to the memory array (14). A first insulative layer (40) is formed outwardly of the substrate (12), the access line structures (16), and the periphery structure (20). A contact area of the periphery structure (20) is exposed through the first insulative layer (40) while maintaining the first insulative layer (40) over at least a contact overlap portion (48) of the access line structures (16). A second insulative layer (60) is formed outwardly of the substrate (12), the access line structures (16), the periphery structure (20), and the first insulative layer (40). A self-aligned contact hole (70) overlapping the contact overlap portion (48) of the access line structures (16) and a periphery contact hole (72) overlapping the contact area (46) of the periphery structure (20) are formed through the second insulative layer (60) with a same mask (74). A self-aligned contact (80) is formed in the self-aligned contact hole (70) and a periphery contact (82) is formed in the periphery contact hole (72).

4 Claims, 3 Drawing Sheets

METHOD FOR FORMING MEMORY ARRAY AND PERIPHERY CONTACTS USING A SAME MASK

This application claims priority under 35 USC 119(e) from provisional patent application Ser. No. 60/102,177, filed Sep. 28, 1998.

TECHNICAL FIELD OF THE INVENTION

This invention relates generally to electronic circuits and more particularly to a method for forming memory array and periphery contacts using a same mask.

BACKGROUND OF THE INVENTION

Modern electronic equipment such as televisions, telephones, radios and computers are generally constructed of solid state devices. Solid state devices are preferred in electronic equipment because they are extremely small and relatively inexpensive. Additionally, solid state devices are very reliable because they have no moving parts, but are based on the movement of charge carriers.

Solid state devices may be transistors, capacitors, resistors and other semiconductor devices. Typically, such devices are fabricated on and in a substrate and interconnected to form memory arrays, logic structures, timers and other integrated circuits. One type of memory array is a dynamic random access memory (DRAM) in which memory cells retain information only temporarily and are refreshed at periodic intervals. Despite this limitation, DRAMs are widely used because they provide low cost per bit of memory, high device density and feasibility of use.

DRAMs typically include a memory array and a peripheral circuit that provides addressing and other functions for the memory array. The trend toward denser DRAM arrays has led to the use of additional mask levels and processing steps to form self-aligned contacts (SACTs) within the DRAM. The use of separate mask levels significantly increases the manufacturing time and cost of DRAMs.

SUMMARY OF THE INVENTION

In accordance with the present invention, a method for forming memory array and periphery contacts is provided that substantially eliminates or reduces the disadvantages or problems associated with previously developed methods. In particular, the present invention provides a method that uses a same mask to form memory array and periphery contacts in a dynamic random access memory (DRAM) or other suitable electronic circuit.

In one embodiment of the present invention, contacts for an integrated circuit are formed by providing a substrate that has at least two access line structures for a memory array and a periphery structure for a peripheral circuit to the memory array. A first insulative layer is formed outwardly of the substrate, the access line structures, and the periphery structure. A contact area of the periphery structure is exposed through the first insulative layer while maintaining the first insulative layer over at least a contact overlap portion of the access line structures. A second insulative layer is formed outwardly of the substrate, the access line structures, the periphery structure, and the first insulative layer. A self-aligned contact hole overlapping the contact overlap portion of the access line structures and a periphery contact hole overlapping the contact area of the periphery structure are formed through the second insulative layer with a same mask. A self-aligned contact is formed in the self-aligned contact hole and a periphery contact is formed in the periphery contact hole.

Technical advantages of the present invention include providing an improved method for forming contacts for an electronic circuit. In particular, an insulative layer is etched to expose a contact area of the periphery structure, while maintaining the insulative layer over the access line structures. Accordingly, a separate mask and etch process is not needed to expose the periphery contact area, and a same mask and etch process is used to form memory array contact holes and periphery contact holes. As a result, the integrated circuit may be fabricated more efficiently both in terms of cost and processing time.

Other technical advantages of the present invention will be readily apparent to one skilled in the art from the following figures, descriptions and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, in which.

DETAILED DESCRIPTION OF THE INVENTION

FIGS. 1A–H are a series of schematic cross-sectional diagrams illustrating a method for forming contacts for an electronic circuit. For the embodiment of FIGS. 1A–H, the electronic circuit is a dynamic random access memory (DRAM). Although the present invention is described in connection with the DRAM, it will be understood that the present invention may be used to form contacts for other for other types of memory devices and other suitable electronic circuits having discrete sections with disparate devices and contact configurations. For example, this method may be used in connection with a static random access memory (SRAM).

Figure 1A:
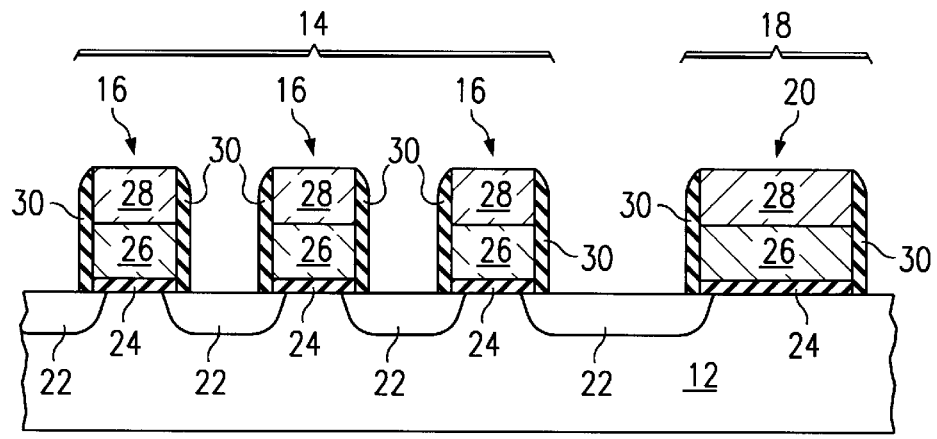
FIGS. 1A–H are a series of schematic cross-sectional diagrams illustrating a method for forming memory array and periphery contacts for a dynamic random access memory (DRAM) device in accordance with one embodiment of the present invention.

Referring to FIG. 1A, an initial structure 10 for the DRAM includes a substrate 12 having a memory array section 14 with a plurality of access line structures 16 and a peripheral circuit section 18 with one or more periphery structures 20. The substrate 12 comprises a semiconductor material such as single crystalline silicon. The substrate 12 is a semiconductor wafer, an epitaxial layer grown on a wafer, a semiconductor on insulation (SOI) system or other suitable structure. The substrate 12 may include previously formed source and drain regions 22 for the access line and periphery structures 16 and 20. Formation of the source and drain regions 22 may include deposition of an oxide sidewall layer for source/drain implants. The substrate 12 may also include other active devices (not shown) such as transistors, capacitors, resistors and the like. Accordingly, the access line and periphery structures 16 and 20 may be constructed in the midst of other active devices, as long as the core and input/output devices are suitably isolated from the other devices.

The access line structures 16 may form word lines, bit lines, transistors, or other suitable devices used directly or indirectly to selectively access memory cells in the memory array. The periphery structure 20 may form transistors or other logic devices used to address, access or perform other functions for the memory array. For the DRAM embodiment, each access line structure 16 forms a word line that connects cells in a particular row of the memory array. The periphery structure 20 forms a logic gate used to address memory cells in the array. In this embodiment, the access line and periphery structures 16 and 20 each include a gate dielectric 24 disposed outwardly of the substrate 12, a gate electrode 26 disposed outwardly of gate dielectric 24, a disposable cap 28 disposed on the gate electrode 26, and sidewalls 30 formed along the sides of the gate electrode 26 and disposable cap 28.

The gate dielectrics 24 are conventionally formed by growing, patterning and etching in oxide or other suitable dielectric layer. The gate electrodes 26 are conventionally formed by depositing, patterning and etching a gate layer. The gate layer comprises polysilicon, tungsten, a tungsten silicide over polysilicon stack, a titanium nitride stack, or other suitable gate materials. The disposable caps 28 are formed by patterning and etching a cap layer with the gate layer. The cap layer comprises doped oxide, such as phosphosilicate glass (PSG) or boron phosphosilicate glass (BPSG) or any other suitable material that may be selectively removed from the gate electrodes 26 and the sidewalls 30. The sidewalls 30 are conventionally formed by depositing and anisotropically etching a conformal sidewall layer. The sidewall layer comprises nitride or other suitable dielectric material.

In one embodiment the memory array has a design rule of 0.16 microns-in which the access line gates 26 each have a width of 0.16 microns and are each spaced apart by 0.16 microns. The periphery gate 26 has a width of 0.30 microns. In this embodiment, the gate dielectrics 24 may be about 50 Å thick, the gate electrodes 26 may be about 3,000 Å thick, the disposable caps 28 may be about 2,000 Å thick, and the conformal sidewall layer from which the sidewalls 30 are formed may be about 300 Å thick. It will be understood that the present invention is not limited to a design rule of 0.16 microns but may be used for other sub-micron design rules that use self-aligned contacts due to space constraints between access lines.

Figure 1B:
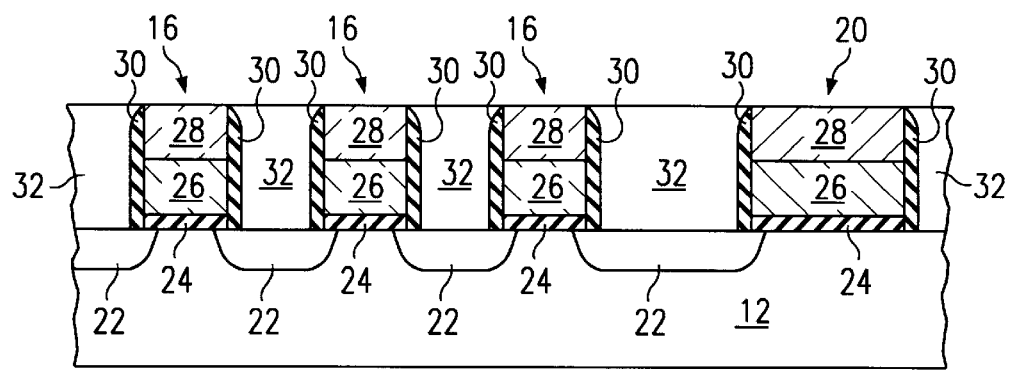
Figure 1C:
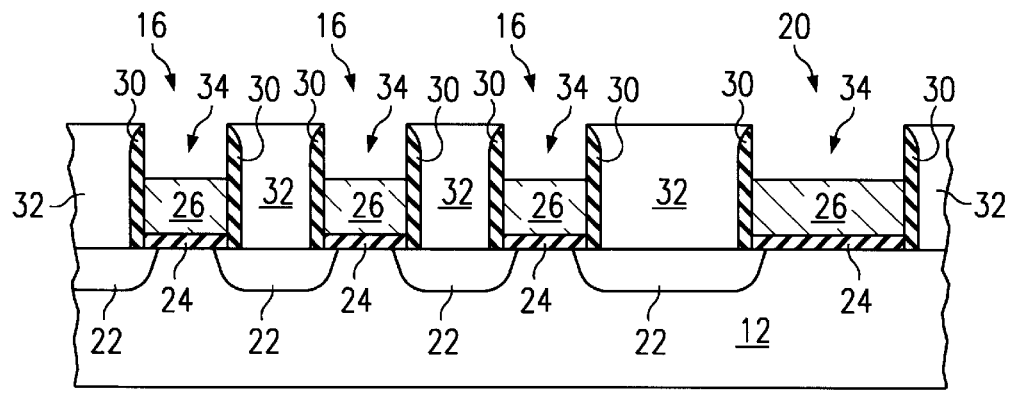

Referring to FIG. 1B, an initial insulative layer 32 is formed outwardly of the substrate 12 between sidewalls 30 of the access line and periphery structures 16 and 20. The initial insulative layer 32 is formed by deposition of a dielectric material, followed by planarization of that material. The initial insulative layer 32 is planarized by chemical mechanical polishing (CMP) or other suitable technique. The initial insulative layer 32 should be formed of material that allows the disposable caps 28 to be selectively removed without damaging the initial insulative layer 32. For the 0.16 micron design rule embodiment in which the substrate 12 comprises silicon, the sidewalls 30 comprise nitride, and the disposable caps 28 comprise PSG, the initial insulative layer 32 comprises an undoped oxide such as high density plasma (HDP) or atmospheric pressure chemical vapor deposition (APCVD), conventionally deposited to a thickness of about 6,000–7,000 Å and planarized to expose the disposable caps 28. Referring to FIG. 1C, the disposable caps 28 are removed to form cavities 34 over gate electrodes 26. The disposable caps 28 are preferably removed by an etch process that is highly selective to the initial insulative layer 32, the sidewalls 30, and the gate electrodes 26. This allows the disposable caps 28 to be removed without damaging the initial insulative layer 32, the sidewalls 30, or the gate electrodes 26. For the embodiment where the disposable caps 28 comprise PSG, the initial insulative layer 32 comprises undoped oxide, the sidewalls 30 comprise nitride, and the gate electrodes 26 comprise a tungsten silicide over polysilicon stack, this etch is a vapor hydrogen fluoride (HF) etch.

Figure 1D:
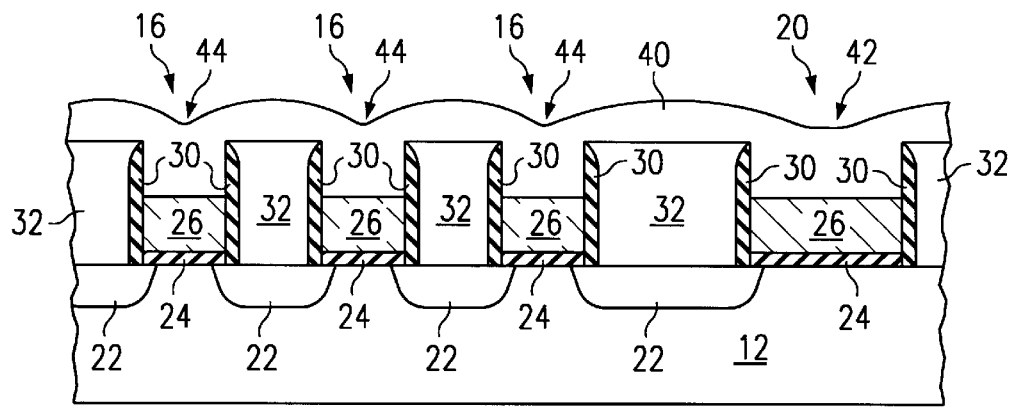

Referring to FIG. 1D, a first insulative layer 40 is deposited outwardly of the cavities 34 and initial insulative layer 32. The first insulative layer 40 is sufficiently conformal to the underlying structure of the cavities 34 such that the first insulative layer 40 is thinner over a center area 42 of the wider periphery cavity 34 than a center area 44 of the narrower access line cavities 34. As a result, as described in more detail below, the first insulative layer 40 may be anisotropically etched to expose the periphery gate 26 while still covering the access line gates 26. The disparate thicknesses of the first insulative layer 40 over the access line and periphery gates 26 will vary depending on the relative widths of the gates and may be controlled by varying the thickness of the first insulative layer 40 or the disposable caps 28 or by varying the technique, energy, or other suitable criteria of the deposition process. Preferably, the periphery gates 26 are at least 1.5 times the width of the access line gates 26. In this embodiment, the first insulative layer 40 may be deposited by conventional chemical vapor deposition (CVD) techniques and has a thickness over the center area 44 of the access line gates 26 that is about two-thirds of the width of the access line gates 26. Accordingly, for the 0.16 micron design rule embodiment, the first insulative layer 40 is about 1,800 Å thick over the center area 44 of the access line gates 26. The first insulative layer 40 is about 1,000 Å thick over the center area 42 of the periphery gate 26.

The first insulative layer 40 should be formed of material that is selectively removable from the gate electrodes 26 and the initial insulative layer 32. This allows the first insulative layer 40 to be removed without damaging the gate electrodes 26 or the initial insulative layer 32 and allows the initial insulative layer 32 to be removed without damaging the first insulative layer 40. For the embodiment where the gate electrodes 26 comprise a tungsten silicide over polysilicon stack and the initial insulative layer 32 comprises undoped oxide, the first insulative layer 40 comprises nitride deposited by low pressure chemical vapor deposition.

Figure 1E:
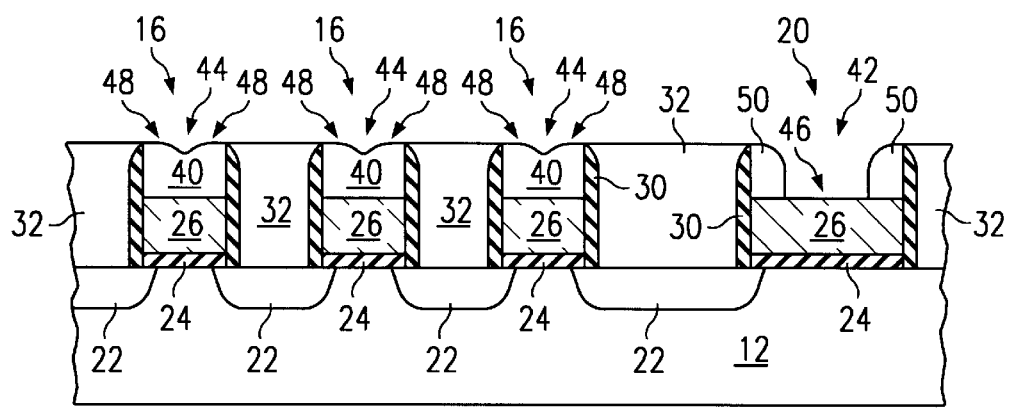

Referring to FIG. 1E, the first insulative layer 40 is blanketly etched to expose a contact area 46 of the periphery structure 20 through the first insulative layer 40, while maintaining the first insulative layer 40 over at least a contact overlap portion 48 of the access line structure 16. As described in more detail below, this allows a same mask and etch process to be used to form self-aligned contact holes to the access line structure 16 and to form a contact hole to the periphery structure 20. The contact overlap portion 48 is that portion of each access line structure 16 that is overlapped by the self-aligned contact hole. Preferably, the first insulative layer 40 is maintained over the entire width of the access line gates 26, is removed from the initial insulative layer 32, and forms inward sidewalls 50 over ends of the periphery gate 26.

The first insulative layer 40 is etched by an anisotropic etch that is selective to the initial insulative layer 32 and to the gate electrodes 26. For the embodiment where the first insulative layer 40 comprises nitride, the initial insulative layer 32 comprises undoped oxide, and the gate electrodes 26 comprise a tungsten silicide over polysilicon stack, this may be a plasma etch or fluorine-based etch.

Figure 1F:
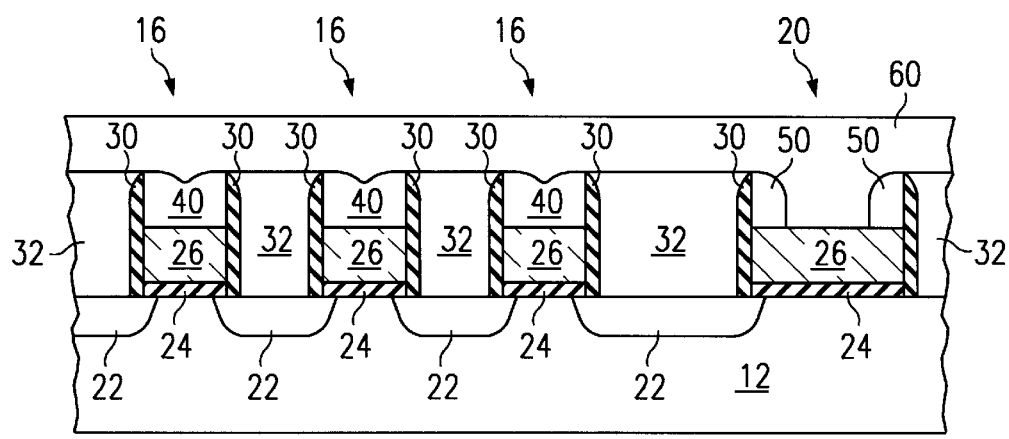

Referring to FIG. 1F, a second insulative layer 60 is formed outwardly of the substrate 12. The second insulative layer 60 is formed by deposition and planarization of a dielectric material. The second insulative layer 60 is planarized by CMP, reflow, or other suitable technique.

The material of the second insulative layer 60 should be selectively removable from the sidewalls 30, from the first insulative layer 40, and from the gate electrode 26 of the periphery structure 20. This allows the second insulative layer 60 to be removed without damaging the sidewalls 30, the first insulative layer 40, or the gate electrode 26 of the periphery structure 20. For the 0.16 micron design rule embodiment where the sidewalls 30 and the first insulative layer 40 comprise nitride and the gate electrodes 26 comprise a tungsten silicide over polysilicon stack, the second insulative layer 60 comprises oxide conventionally deposited and planarized to a thickness of about 2,000–3,000 Å over the initial insulative layer 32.

Figure 1G:
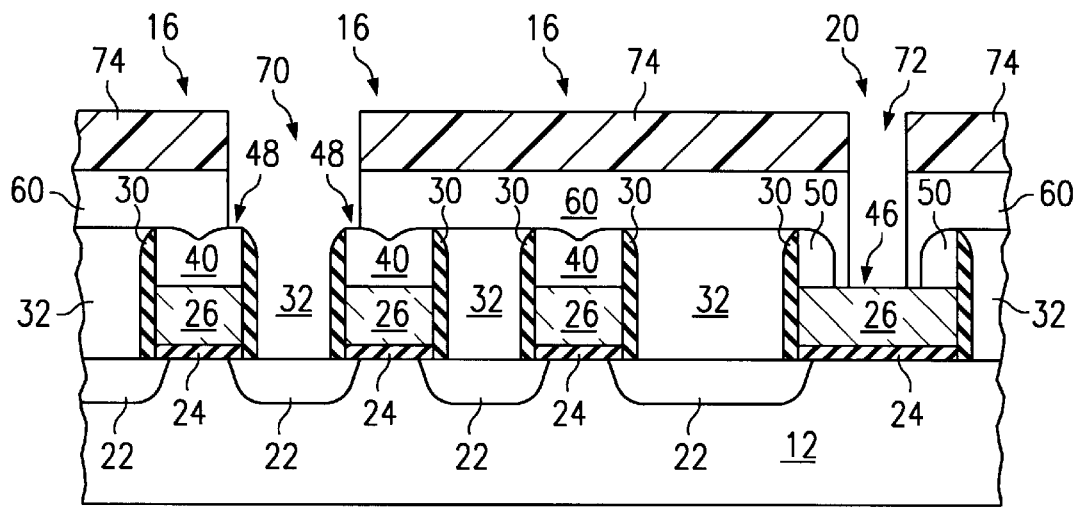

Referring to FIG. 1G, self-aligned contact holes 70 and a periphery contact hole 72 are formed in the second insulative layer 60 by patterning and etching the second insulative layer 60 using a same mask 74. The mask 74 is a conventional photo lithographic mask. The self-aligned contact holes 70 overlap the contact overlap portions 48 of the access line structure 16 and extend to the substrate 12 to expose the source and drain regions 22 of the access line structure 16. The periphery contact hole 72 extends to the periphery gate 26 to expose the periphery contact area 46. Accordingly, a separate mask and etch process is not needed to expose the periphery contact area and manufacturing costs for the DRAM are reduced.

During the contact hole etch process, the first insulative layer 40 remaining over the access line structures 16 acts as an etch stop to prevent exposure of the access line gates 26 and consequential shorting between the gate 26 and contacts formed in the self-aligned contact hole 70. Conversely, absence of the first insulative layer 40 from over the periphery contact area 46 allows exposure of the contact area 46 and connection with a contact formed in the periphery contact hole 72. The etch should thus be selective to the sidewalls 30, the first insulative layer 40, and the gate electrodes 26. This allows the contact holes 70 and 72 to be formed by removing the initial insulative layer 32 and the second insulative layer 60 without damaging the sidewalls, the first insulative layer 40, or the gate electrode 26 of the periphery structure 20. For an embodiment where the initial insulative layer 32 comprises undoped oxide, the second insulative layer 60 comprises oxide, the sidewalls 30 and the first insulative layer 40 comprise nitride, and the gate electrodes 26 comprise a tungsten silicide over polysilicon stack, the etch is a fluorine-based etch.

Figure 1H:
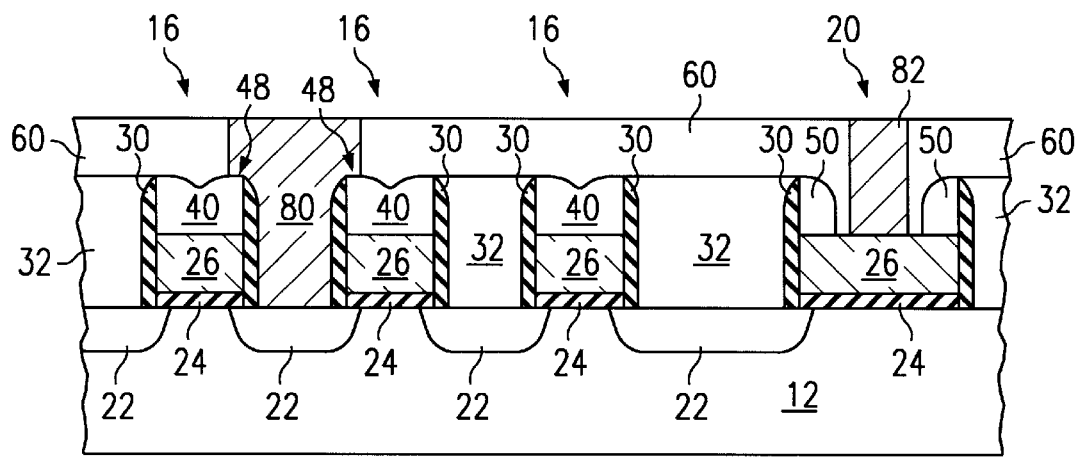

Referring to FIG. 1H, a self-aligned contact 80 is formed in the self-aligned contact hole 70 and a periphery contact 82 is formed in the periphery contact hole 72. The self-aligned contact overlaps the access line structure 16 and is thus self-aligned between the access line structures 16. The self-aligned contact extends between the access line structures 16 to connect to the source and drain regions 22 of the substrate 12. In this embodiment, the contact is a bit line contact. The periphery contact 82 extends to the periphery gate 26 to form a gate contact. It will be understood that the self-aligned and periphery contacts 80 and 82 may connect with other types of active areas and form other types of contacts for the access line and periphery structures 16 and 20. For example, the self-aligned contact could be a storage node contact.

The self-aligned and periphery contacts 80 and 82 are formed by depositing a conductive layer outwardly of the second insulative layer 60 and in the contact holes 70 and 72. The conductive material is a metal such as titanium nitride. The conductive layer is patterned and etched or planarized to isolate the contacts 80 and 82. Additional contacts and elements may thereafter be formed for the DRAM in accordance with conventional integrated circuit processing techniques.

Although the present has been described with several embodiments, various changes and modifications may be suggested to one skilled in the art. It is intended that the present invention encompass such changes and modifications as fall within the scope of the appended claims.

What is claimed is:

1. A method of integrated circuit contact opening formation, comprising:
   (a) forming a first insulative layer on first and second conductive line structures at a surface of a substrate;
   (b) forming a first opening in said first insulative layer to expose a portion of said first conductive line structure while maintaining said first insulative layer on said second conductive line structure;
   (c) forming a second insulative layer on said first insulative layer and on said exposed portion of said first conductive line structure;
   (d) masking said second insulative layer and etching using said masking to form (i) a first contact opening through said second insulative layer to said first conductive line structure at said first opening in said first insulative layer plus (ii) a second contact opening through said second insulative layer and extending to said surface adjacent said second conductive line structure and said maintained first insulative layer;
   (e) wherein said etching etches said second insulative layer at a higher rate than said first insulative layer.

2. The method of claim 1, wherein:
   (a) said forming a first opening of step (b) of claim 1 includes a global etch of said first insulative layer.

3. The method of claim 1, wherein:
   (a) said first and second conductive line structures are gates.

4. The method of claim 1, wherein;
   (a) said first insulative layer is a silicon nitride: and (b) said second insulative layer is a silicon oxide.

* * * * *